United States Patent [19]
Ries

[11] Patent Number: 5,148,123
[45] Date of Patent: Sep. 15, 1992

[54] NEGATIVE FEEDBACK CONTROL LOOP ACQUISITION AID

[75] Inventor: Gordon W. Ries, Plano, Tex.

[73] Assignee: Alcatel Network Systems, Inc., Richardson, Tex.

[21] Appl. No.: 787,506

[22] Filed: Nov. 4, 1991

[51] Int. Cl.⁵ ............................................. H03L 7/12
[52] U.S. Cl. ........................................... 331/4; 331/17; 331/DIG. 2; 375/120
[58] Field of Search ................. 331/4, 17, 25, DIG. 2; 375/120

[56] References Cited

U.S. PATENT DOCUMENTS 4,083,015  4/1978  Popodi .................................. 331/4
4,320,530  3/1982  Ikeda ........................ 331/DIG. 2 X Primary Examiner—David Mis
Attorney, Agent, or Firm—Bruce C. Lutz; Dennis O. Kraft

[57] ABSTRACT

A bandpass filter is used, which closely matches the characteristics of a closed phase lock loop (PLL) so as to provide an acquisition detector output in a PLL being swept. This detector is not activated by noise generated in the loop due to data or other perturbations. This filter includes a differentiator to exacerbate the filtered output and thus, more clearly define the condition being detected. The phase lock acquisition sweep is disabled when the detector output exceeds a predetermined absolute value. The detection scheme works equally well in approaching the lock frequency from above or below actual lock and a latch circuit ensures that the sweep approach always alternates to compensate for an erratic phase detector in the PLL.

5 Claims, 2 Drawing Sheets

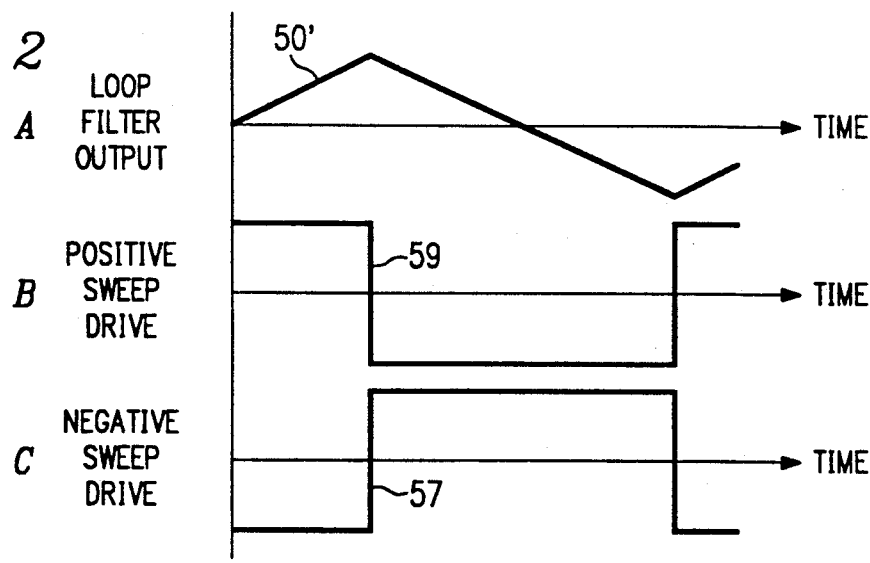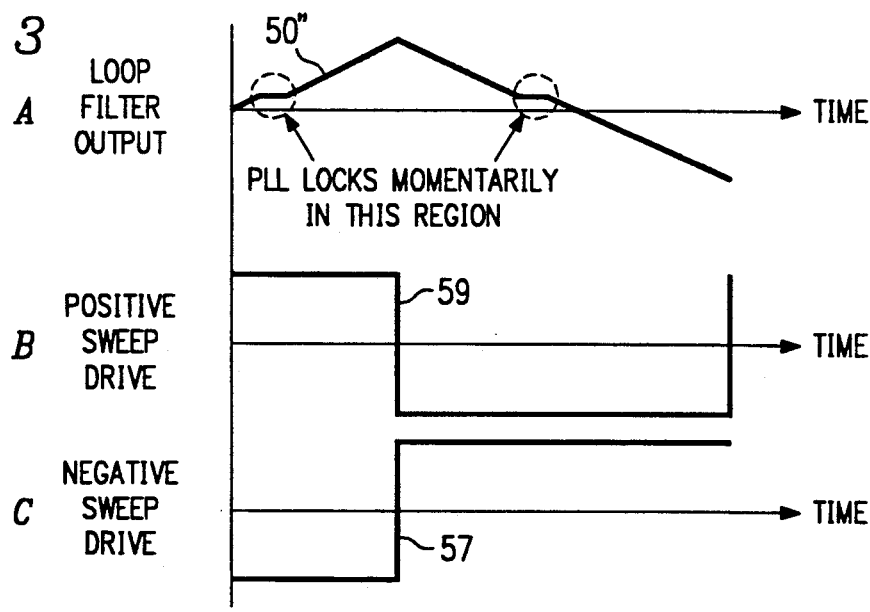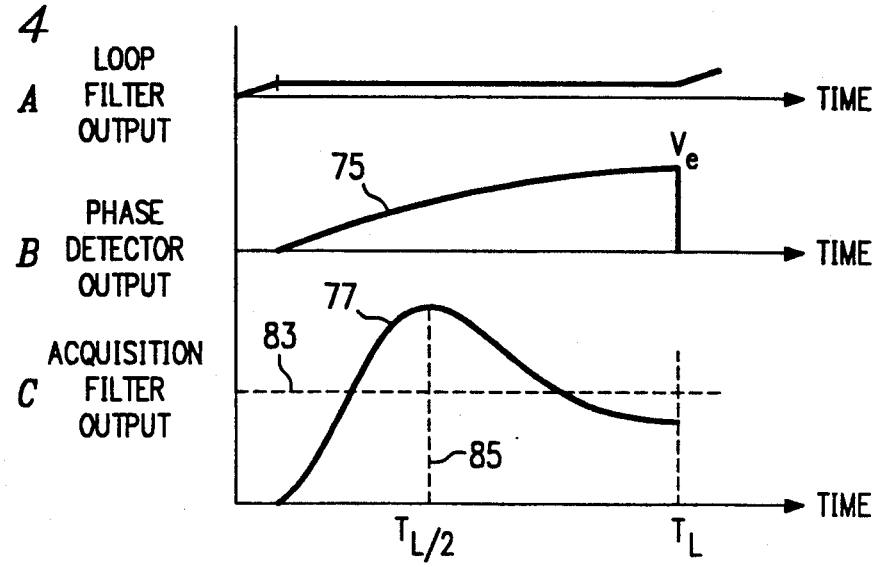

NEGATIVE FEEDBACK CONTROL LOOP ACQUISITION AID

THE INVENTION

The present invention is generally directed to electronics and more specifically to control systems. Even more specifically, the present invention is directed to an approach for detecting the occurrence of control lock in a negative feedback system and for disabling the sweep mechanism utilized in attempting to acquire that locked condition.

BACKGROUND OF THE INVENTION

1. Field of Invention

When a negative feedback control system such as a phase lock loop is not in a locked condition, some kind of sweep such as a frequency sweep over a predetermined search range is used to attempt to find the appropriate parameter such as frequency that is necessary to establish locked conditions. This would be the carrier frequency or clock that is presently being used by the data supplied to a phase lock loop. When a lock condition is established, it is imperative that the sweep be timely disabled so as to prevent the system from immediately losing lock again.

2. Description of Related Art

Known prior art approaches to detecting frequency acquisition have tried 1) embedding a low frequency oscillator in the phase lock loop and 2) detecting the difference frequency "beat note" to determine the lock status of the phase lock loop. The approach used for the first technique referenced supra required the modification of the transfer function of the phase lock loop. This modification, however, meant that it was sensitive to the level of the data pattern dependent phase jitter or, in other words, of random phase perturbations. The presence of non-linear elements (i.e., diodes) causes the out-of-lock detection to be sensitive to the level of the data pattern jitter or momentary phase perturbations. Because of this, the loss of lock detection circuit would think that it had lost "lock" under many conditions when it had not. The second prior art technique, when used with a wide tuning range (greater than one megahertz), caused the loss of lock detection circuit to be sensitive to data pattern jitter thereby initiating false frequency sweeping. This is due to the wide band note detection circuitry mistaking the data pattern energy for a beat note. This second technique is capable of detecting false phase lock but must be restricted to a single direction frequency approach to the lock frequency to overcome false locking.

SUMMARY OF INVENTION

The present approach is insensitive to data pattern jitter since a) the phase detector output is used only to stop the frequency sweep, i.e., momentary phase transients are prevented from initiating a frequency sweep as in the beat note detection scheme, and b) the acquisition filter utilized in the detector operates in a frequency band where the phase lock loop tracks the data pattern jitter. (When locked, the PLL suppresses the phase jitter which is within the bandwidth of the acquisition control circuit. Thus, the only signed "seen" by the lock detection circuit is the characteristic signal produced when the loop comes into lock.) When the present concept is used with a high gain controlled oscillator, the phase lock loop reaction to the sweep drive depends only upon the loop filter resistors and capacitors and thus, is very repeatable and makes the detection of the phase lock loop reaction signal very reliable. Further, in the instances where the phase detector falsely detects a lock condition due to inadequacies in the phase detector utilized as part of the feedback loop, the total approach presented herein continues the sweep in the same direction as before the apparent false lock due to the inherent memory of the Schmitt trigger used and thus, the phase lock loop will acquire lock in the opposite direction in the next half cycle of the sweep. Thus, in instances where an incorporated and less than perfect phase detector can only acquire proper lock on a given direction of frequency sweep, a lock will occur on the next half cycle. This eliminates relying on random signal generation to cause the following sweep approach to be from the "correct" direction.

It is an object of the present invention to provide an improved acquisition aid for a feedback controlled loop.

BRIEF DESCRIPTION OF THE DRAWINGS

Other objects and advantages will be apparent from a reading of the specification and appended claims in conjunction with the drawings wherein:

FIG. 2 comprises sweep related waveforms with no data input;

FIG. 3 comprises sweep related waveforms with data input and with the acquisition circuit disabled;

FIG. 4 provides waveforms of an expanded view of the momentary lock region of FIG. 3 along with signals representing the phase detector output and the acquisition filter output.

DESCRIPTION OF PREFERRED EMBODIMENT(S)

Figure 1:
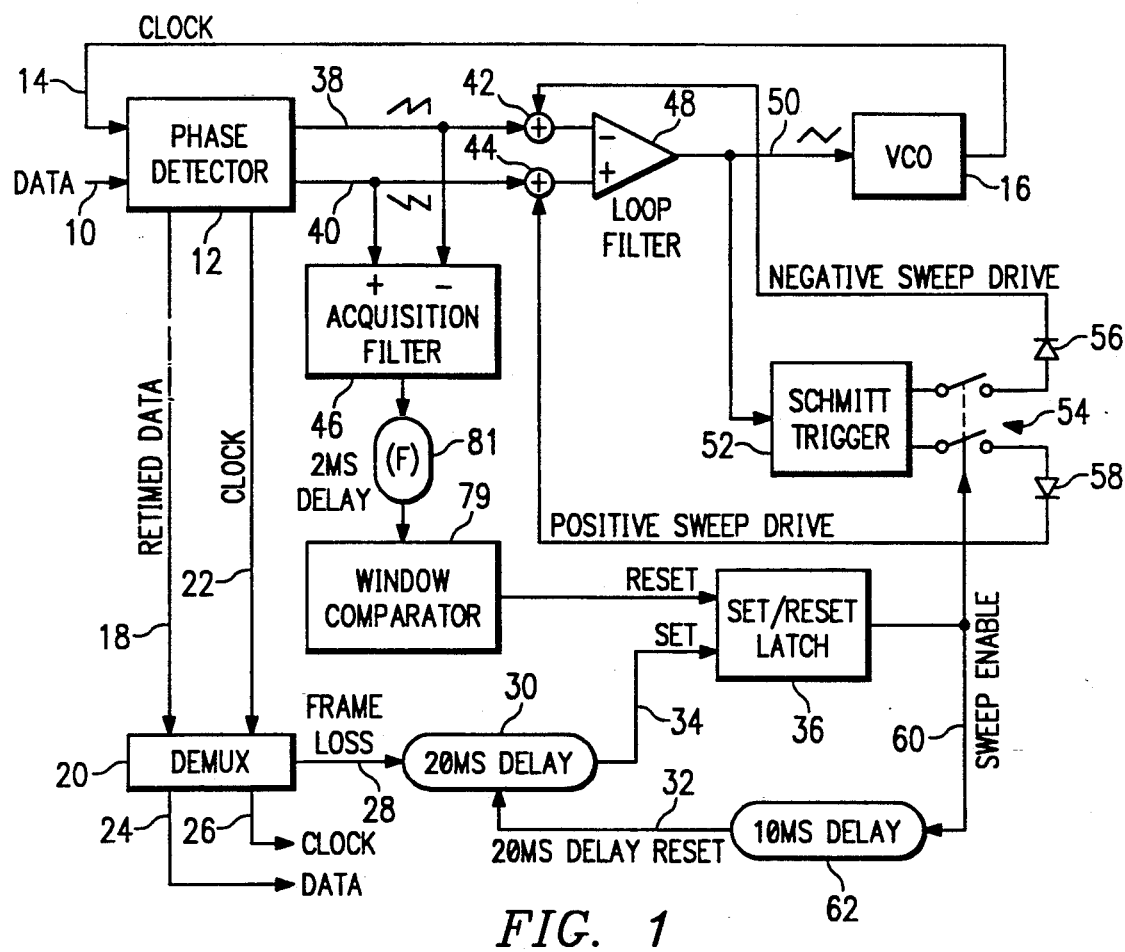
FIG. 1 is a detail block diagram of the inventive concept.

In FIG. 1 data is supplied on a lead 10 to a phase detector block 12 having a clock or feedback signal supplied thereto on a lead 14 from a VCO, variable controlled oscillator or voltage controlled oscillator 16. The data as retimed is supplied on a lead 18 to a demultiplexer 20. Clock signals are supplied on a lead 22 from phase detector 12 to the demultiplexer 20. The data is passed through demultiplexer 20 and provided as part of timed demultiplexed signals on data and clock leads 24 and 26, respectively. A signal indicating frame loss is supplied on a lead 28 to a 20 millisecond delay block 30. Delay block 30 has a 20 millisecond delay reset input lead 32 and has an output on a lead 34 to a set/reset latch circuit 36. The phase detector 12 has outputs on lead 38 and 40 as shown when the sweep from controlled oscillator 16 is being applied and a lock condition has not occurred. A sawtooth of one polarity appears on lead 38 and a sawtooth of an opposite polarity appears on a further lead 40. Lead 38 is applied to a summing circuit 42 and lead 40 is applied to a summing circuit 44. The leads 38 and 40 are also both applied to an acquisition filter 46. The summing means 42 and 44 are applied to negative and positive inputs of a summing amplifier or loop filter 48. The output of loop filter 48 is applied to an input of the controlled oscillator 16 and during sweep operations comprises a triangular waveform as shown above a lead 50. Lead 50 is also supplied to a Schmitt trigger 52. The output of Schmitt trigger 52 is applied through a single throw, double pole switch generally designated as 54. One of the poles of the switch is applied through a diode 56 to a second input of summing means 42. The other pole of switch 54 is applied through a diode 58 to a second input of summing means 44. As illustrated, the line containing diode 56 is a negative sweep drive line. The line containing diode 58 is labeled positive sweep drive. The set latch block 36 provides a signal on a lead 60 to control the operation of switch 54 and also to provide a signal to a 10 millisecond delay block 62. An output of delay block 62 comprises the lead 32 providing a 20 millisecond delay reset to the delay block 30.

FIG. 2 has a first waveform 2A which is indicative of the loop filter output or, in other words, of the signal on lead 50 and thus, this waveform is labeled 50'. Waveform 2B illustrates the positive sweep drive and is labeled 59 and is indicative of the signal passing through diode 58. Waveform 2C provides an indication of the negative sweep drive and a waveform there is labeled 57 and is indicative of the signal passing through diode 56.

FIG. 3 has waveforms 3A, 3B and 3C with the waveforms 3B and 3C corresponding directly to waveforms 2B and 2C. Waveform 3A illustrates the effect of momentary locking if the drive is not interrupted as it would be when the circuit is operating properly.

Waveform 4A shows an expanded version of FIG. 3A in the area of the momentary lock. Thus, FIG. 4 is an expanded time presentation of the lefthand portion of FIG. 3. A waveform 75 of FIG. 4B is alternately represented as $V_c$ and is indicative of the output of phase detector 12. This output rises for one of the leads such as 38 and decreases in amplitude for the other lead such as 40.

Waveform C of FIG. 4 represents the output of the acquisition filter 46. The acquisition filter 46 is essentially a narrow band filter which effectively causes a differentiation of signals on the low frequency side of the bandpass filter. The differentiation enhances the rate of change of signal 75 in waveform 4B to produce waveform 77 in FIG. 4C. Various electronic "trash" from the data signal or the environment will appear on leads 38 and 40 of phase detector 12 when it is not in a locked condition. The amplitude of this "trash", as passed through acquisition filter 46, is less than amplitude 83 shown in FIG. 4C. When the signal represented by waveform 77 increases beyond the level set in window comparator 79 as amplitude 83, a reset output is applied to latch 36. In order to optimize the time of disabling the sweep drive, a two millisecond delay is introduced in block 81 so as to delay the actual removal of the sweep until the PLL is more optimally locked into the phase lock mode. Typically, this is at or slightly beyond the dash line represented as 85 in waveform C. The total time for waveform 75 as output by the phase detector, is represented by $T_L$ in FIG. 4C. The line 85 is at approximately half the time of $T_L$ and thus, is labeled $T_L/2$. This time is the point of greatest rate of change of the waveform 75 of FIG. 4B.

Figure 5:
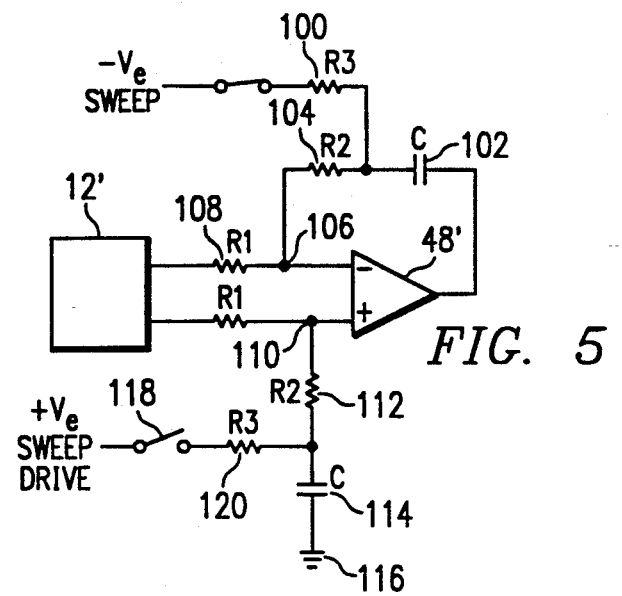
FIG. 5 provides more detail for the design of the loop filter portion of FIG. 1.

FIG. 5 illustrates in more detail the loop filter 48 (now labeled 48') and includes a specific representation of the feedback loop. The signal shown as negative sweep drive in FIG. 1 is applied to a resistor R3 and further labeled as 100 in FIG. 5. A capacitor 102 and a resistor R2, and further labeled as 104, is connected between the output of loop filter amplifier 48' and its negative or inverting input at a summing point 106. A resistor R1 further labeled as 108 is connected between the output of phase detector 12' and junction point 106. A similar junction point 110 is connected to the noninverting or plus input of loop filter amplifier 48' and it is connected through an R2 resistor further labeled as 112 and a capacitor 114 to ground potential 116. The positive sweep drive is connected through an indicated switch 118 and a resistor R3 further designated as 120 to a junction between resistor 112 and capacitor 114. Resistors R1 and R2, as connected to each of junction points 106 and 110, are representative of the summing means 42 and 44 in FIG. 1. Further, the like designated resistors and capacitors have substantially the same impedance values.

OPERATION

The operation of the present concept is believed reasonably straightforward once the concept is understood. The detector 12 along with loop filter 48 and controlled oscillator 16 form a closed phase lock loop which attempts to keep the frequency signal output of VCO 16 exactly in phase with the data being input on data lead 10. When the phase lock loop is in lock, the output on leads 38 and 40 comprises primarily high frequency but low amplitude electronic trash and a DC signal which passes through loop filter 48 to control the frequency of oscillator 16. In normal operation, the Schmitt trigger 52 is not active since it only alters its output signal polarity when the input is greater than a predetermined level and besides, the switch 54 is in an open condition. The data and clock signals output by phase detector 12 are passed through DEMUX 20 to the output leads 24 and 26. When the DEMUX 20 detects loss of frame, an output is supplied on lead 28 and after a 20 millisecond delay in delay block 30, provides a signal to latch 36 to activate switch 54. The 20 millisecond delay prevents spikes on the frame loss line from actuating the frequency sweep. When the latch is set, the 20 millisecond delay 30 is cleared (reset) after ten milliseconds. This assures that the latch 36 is solidly set before the set signal 34 is removed. The two outputs of Schmitt trigger 52 are complementary in that one is positive while the other is negative. The diodes 56 and 58 only pass whichever output is positive. Since the Schmitt trigger provides the opposite polarity outputs on the two leads every time the loop filter output on lead 50 exceeds a predetermined value in a positive or negative direction, the driving signal continually switches from one summing input means of 42 and 44 to the other. When the sweeps shown above lead 50 start occurring, the output of phase detector 12 will be essentially as shown at each occurrence of tentative lock. In addition to the signal shown adjacent leads 38 and 40, there will be high frequency trash due to the data 10 and other extraneous noise. The filter 46 filters out all the trash and when it sees the output shown as 75 or $V_e$ in FIG. 4, the low frequency side of the bandpass filter portion of filter 46 provides a differentiation effect and provides the output shown as 77 in FIG. 4C. When this output exceeds a predetermined absolute value such as that shown by dash line 83, an output is provided to the two millisecond delay 81. Window comparator 79 is merely a level detector for signals either in the positive or negative direction. The delay 81 causes an output from comparator 77 to be applied to latch 36 at approximately the time of dash line 85 which is a more nearly optimal time to remove the sweep than the time that waveform 77 initially exceeds amplitude 83. The application of a signal to latch 36 provides a signal on lead 60 to open the switch 54 and remove any further sweeping action from the loop filter 48. If this is an instance of false lock, the output of loop filter 48 typically will remain low enough so as to not reset the Schmitt trigger 52 and if frame loss signal 28 continues to appear after 20 millisecond delay of block 30, the latch 36 is again set and the switch 54 again activated so that Schmitt trigger 52 continues its output in the same direction as previously to attempt to find phase lock at another frequency or to attempt to obtain phase lock approaching the previous frequency from the opposite direction.

The characteristics of the locked phase lock loop response to the sweep drive signal can be primarily described using the resistors R1 through R3 and the capacitor C of FIG. 5. The waveform 75 may be described by the following formula:

$$V_e(t) = -AK(1 - e^{-t/\tau}) \qquad (1)$$

$$\text{where: } K = \frac{R_1}{R_2} \cdot \frac{1}{R_3 C}$$

$$\text{and where: } \tau = \frac{1}{\frac{R_2 + R_3}{R_2} \cdot \frac{1}{R_3 C}}$$

From the above, it may be ascertained that the total period of waveform 75 from the commencement of its rise to the righthand portion of FIG. 4B, is determined by its amplitude A, K and $\tau$ and the phase detector phase range. The acquisition filter 46 is used to compress the signal $V_e$ (75) in time so that the loop locked decision can be made earlier in time to avoid driving the loop too far away from the optimal lock point. The acquisition filter thus has the characteristics shown in waveform 77 of FIG. 4C. This filter may be described by the following equation:

$$V_a(t) = -2A(e^{-t/T_L} - e^{-t/T_L/4}) \qquad (2)$$

where $V_a(t)$ describes the amplitude of waveform 77 and $T_L$ is the time as shown in FIG. 4C.

While I have described the concept with respect to a phase lock loop, it is to be realized that this concept can apply to any closed loop negative feedback control system and I wish to be limited not by the specific invention illustrated and described but only by the scope of the inventive concept of matching a filter to the characteristics of the negative feedback loop so that beat frequencies and other noise or signal trash is ignored and only the signal representative of attempted phase lock is detected and intensified for optimally removing the sweep signal at the proper time as claimed in the following claims:

I claim:

1. A method of acquiring phase lock in a phase lock system including a phase detector, a loop filter and a VCO (controlled oscillator) which is periodically swept in frequency when an out-of-lock condition is detected comprising the steps of:
    filtering an output of a phase detector portion of the phase lock loop to remove beat frequency signals;
    differentiating the filtered output; and
    interrupting any periodic sweep frequency action on the part of a VCO portion of the phase lock loop if the differentiated output exceeds a given value.

2. A method of acquiring phase lock in a phase lock system including a phase detector, a loop filter and a VCO (controlled oscillator) which is periodically swept in frequency when an out-of-lock condition is detected comprising the steps of:
    filtering an output of a phase detector portion of the phase lock loop to remove beat frequency signals;
    detecting a unique rate of change of said filtered output, dependent upon phase lock loop system parameters, in the filtered output; and
    interrupting any periodic sweep frequency action on the part of a VCO portion of the phase lock upon detection of the unique rate of change signal exceeding a predetermined absolute value.

3. The method of detecting the commencement of negative feedback control in a negative feedback system having a primary signal and a feedback signal merged in a feedback signal combiner device comprising the steps of:
    monitoring output signals of a feedback signal combiner device while causing a feedback signal to be swept over a predetermined range for the purpose of acquiring a stable negative feedback system;
    detecting a unique rate of change of said monitored output; and
    interrupting any sweep action occurring in the negative feedback system upon detection of the unique rate of change signal exceeding a predetermined value.

4. Apparatus of the class described comprising, in combination:
    variable parameter feedback signal altering means, including input means, for providing a feedback signal in accordance with given inputs;
    primary signal supplying means for supplying a primary signal to be tracked;
    multiplicative signal processing means for providing an output control signal which is a function of associated parameters of said feedback signal and said primary signal, said signal processing means including input means connected to said signal altering means and said primary signal supplying means for receiving said feedback and primary signal therefrom respectively and further including output means;
    circuit means, connected between said output means of said signal processing means and said input means of said signal altering means for processing signals therebetween and for completing a negative feedback portion of a control system, said circuit means also including means for varying the feedback signal over an acquisition search range upon command; and
    detection means, connected between said output means of said signal processing means and a command input of said circuit means, for detecting a unique rate of change of said output control signal and upon detecting said unique rate of change preventing said circuit means from further varying the feedback signal over the acquisition search range.

5. Phase detector apparatus comprising, in combination:
    phase lock loop means including a phase detector having a primary signal input of a given carrier frequency and an output signal indicative of a difference in phase between an oscillator feedback signal and the primary signal, a loop filter and a controlled oscillator arranged in a feedback configuration;

sweep means, connected to said phase lock loop, for causing said controlled oscillator to be swept in frequency over a search range in a PLL (phase lock loop) acquisition mode; and detection means, connected between said phase detector and said sweep means, for detecting a unique rate of change of said output signal of said phase detector and preventing further changes in sweep frequency upon detecting said unique rate of change.

* * * * *